US011923464B2

(12) United States Patent
Sasaki et al.

(10) Patent No.: US 11,923,464 B2
(45) Date of Patent: Mar. 5, 2024

(54) SCHOTTKY BARRIER DIODE (71) Applicants: TAMURA CORPORATION, Tokyo (JP); Novel Crystal Technology, Inc., Saitama (JP)

(72) Inventors: Kohei Sasaki, Saitama (JP); Daiki Wakimoto, Saitama (JP); Yuki Koishikawa, Saitama (JP); Quang Tu Thieu, Saitama (JP)

(73) Assignees: Tamura Corporation, Tokyo (JP); Novel Crystal Technology, Inc., Saitama (JP)

( * ) Notice: Subject to any disclaimer, the term of this patent is extended or adjusted under 35 U.S.C. 154(b) by 151 days.

(21) Appl. No.: 16/628,078

(22) PCT Filed: Jun. 12, 2018

(86) PCT No.: PCT/JP2018/022297
§ 371 (c)(1),
(2) Date: Jan. 2, 2020

(87) PCT Pub. No.: WO2019/009021
PCT Pub. Date: Jan. 10, 2019

(65) Prior Publication Data
US 2021/0151611 A1    May 20, 2021

(30) Foreign Application Priority Data
Jul. 6, 2017 (JP) ................. 2017-132565

(51) Int. Cl.
*H01L 29/872* (2006.01)
*H01L 29/24* (2006.01)
*H01L 29/47* (2006.01)
*H01L 29/78* (2006.01)

(52) U.S. Cl.
CPC .......... *H01L 29/8725* (2013.01); *H01L 29/24* (2013.01); *H01L 29/47* (2013.01); *H01L 29/7802* (2013.01)

(58) Field of Classification Search
CPC . H01L 29/8725; H01L 29/7802; H01L 29/24; H01L 29/47; H01L 29/0616;
(Continued)

(56) References Cited

U.S. PATENT DOCUMENTS 11,081,598 B2    8/2021    Sasaki et al.
2007/0023781 A1    2/2007    Mizukami et al.
(Continued)

FOREIGN PATENT DOCUMENTS

CN    101868862 A    10/2010
CN    110352498 A    10/2019
(Continued)

OTHER PUBLICATIONS

Sasaki et al., First Demonstration of Ga2O3 Trench MOS-Type Schottky Barrier Diodes, Jun. 2017, IEEE Electron Device Letters, vol. 38, No. 6. (Year: 2017).*
(Continued)

*Primary Examiner* — Mohammad A Rahman
(74) *Attorney, Agent, or Firm* — Scully, Scott, Murphy & Presser, PC (57) ABSTRACT

A Schottky barrier diode includes a semiconductor layer including a $Ga_2O_3$-based single crystal, an anode electrode that forms a Schottky junction with the semiconductor layer and is configured so that a portion in contact with the semiconductor layer includes Mo or W, and a cathode electrode. A turn-on voltage thereof is not less than 0.3 V and not more than 0.5 V.

3 Claims, 8 Drawing Sheets

(58) Field of Classification Search
CPC ......... H01L 29/66143; H01L 29/66212; H01L 29/66643; H01L 29/7806; H01L 29/782; H01L 29/872
See application file for complete search history.

(56) References Cited

U.S. PATENT DOCUMENTS

| | | | | |
|---|---|---|---|---|
| 2014/0239452 | A1* | 8/2014 | Sasaki | H01L 21/02631 257/613 |
| 2015/0364646 | A1* | 12/2015 | Morishima | H01L 33/32 257/76 |
| 2019/0006473 | A1* | 1/2019 | Tsuruma | H01L 29/872 |
| 2019/0252191 | A1* | 8/2019 | Liang | H01L 21/225 |
| 2020/0066921 | A1 | 2/2020 | Sasaki et al. | |

FOREIGN PATENT DOCUMENTS

| | | |
|---|---|---|
| EP | 2 754 736 A1 | 7/2014 |
| EP | 2 942 804 A1 | 11/2015 |
| EP | 3 174 101 A1 | 5/2017 |
| EP | 3 451 388 A1 | 3/2019 |
| EP | 3 588 580 A1 | 1/2020 |
| JP | 2010233406 * | 3/2009 |
| JP | 2010233406 A | 10/2010 |
| JP | 2017112127 * | 12/2015 |
| JP | 5874946 B2 | 3/2016 |
| JP | 2017-112127 A | 6/2017 |
| WO | 2017110940 A1 | 6/2017 |

OTHER PUBLICATIONS

International Search Report dated Sep. 4, 2018 issued in PCT/JP2018/022297.

Sasaki, Kohei et al., "Ga2O3 Schottky Barrier Diode with Trench MOS Structure", The 64th Japan Society of Applied Physics Spring Meeting (2017).

Sasaki, Kohei et al., "Ga2O3 Schottky Barrier Diodes Fabricated by Using Single-Crystal β—Ga2O3 (010) Substrates", IEEE Electron Device Letters (Apr. 2013), vol. 34, No. 4, pp. 493-495.

Oishi, Toshiyuki, "Conduction mechanism in highly doped β-Ga2O3δ (201) single crystals grown by edge-defined film-fed growth method and their Schottky barrier diodes", Japanese Journal of Applied Physics (2016), 55, 030305.

Shimizu, Takashi, "100V Trench MOS Barrier Schottky Rectifier Using Thick Oxide Layer (TO-TMBS)", Proceedings of 2001 International Symposium on Power Semiconductor Devices & ICs, Osaka, pp. 243-246.

Khemka, V., "A Fully Planarized 4H-SiC Trench MOS Barrier Schottky (TMBS) Rectifier", IEEE Electron Device Letters (May 2000), vol. 21, No. 5, pp. 286-288.

Extended European Search Report dated Feb. 18, 2021 from related EP 18 82 8534.0.

Farzana, Esmat et al.: "Influence of metal choice on (010) [beta]-Ga2O3 Schottky diode properties", Applied Physics Letters, May 16, 2017 (May 16, 2017), pp. 1-5, vol. 110, No. 20, A I P Publishing LLC, US, XP012218976.

Official Action dated Aug. 17, 2021 received from the Japanese Patent Office from related JP 2017-132565 together with English language translation.

Official Action dated Jul. 6, 2022 received from the European Patent Office in related EP 18 828 534.0.

Kohei Sasaki et al., "First Demonstration of Ga2O3 Trench MOS-Type Schottky Barrier Diodes", IEEE Electron Device Letters, vol. 38, No. 6, pp. 783-785.

Official Action dated Mar. 13, 2023 received from the China National Intellectual Property Administration in related application CN 201880044999.6.

* cited by examiner

SCHOTTKY BARRIER DIODE

TECHNICAL FIELD

The invention relates to a Schottky barrier diode.

BACKGROUND ART

A Schottky barrier diode, in which a Schottky electrode formed of Pt is connected to a $Ga_2O_3$ single crystal, is known (see, e.g., Non-Patent Literature 1). The turn-on voltage (forward voltage) of the Schottky barrier diode described in Non-Patent Literature 1 is 1.23 V.

Also, a Schottky barrier diode, in which a Schottky electrode having a Ni/Au stacked structure is connected onto a $Ga_2O_3$ single crystal, is known (see, e.g., Non-Patent Literature 2).

Also, a Schottky barrier diode, which has a Schottky electrode containing one selected from the group consisting of Au, Pd, Pt, Ni, Mo, W, Ta, Nb, Cr, Ag, In and Al, is known (see, e.g., Patent Literature 1).

Also, a trench MOS Schottky barrier diode using Si as a semiconductor layer and a trench MOS Schottky barrier diode using SiC as a semiconductor layer are known (e.g., Non-Patent Literatures 3 and 4).

CITATION LIST

Patent Literature

Patent Literature 1: Japanese Patent No. 5874946

Non-Patent Literatures

Non-Patent Literature 1: Kohei Sasaki et al., "$Ga_2O_3$ Schottky Barrier Diodes Fabricated by Using Single-Crystal β-$Ga_2O_3$ (010) Substrates", IEEE Electron Device Letters, April 2013, Vol. 34, No. 4, pp. 493-495.
Non-Patent Literature 2: Toshiyuki Oishi et al., "Conduction mechanism in highly doped β-$Ga_2O_3$ (−201) single crystals grown by edge-defined film-fed growth method and their Schottky barrier diodes", Japanese Journal of Applied Physics, 2016, 55, 030305.
Non-Patent Literature 3: T. Shimizu et al., Proceedings of 2001 International Symposium on Power Semiconductor Devices & ICs, Osaka, pp. 243-246 (2001)
Non-Patent Literature 4: V. Khemka, et al., IEEE ELECTRON DEVICE LETTERS, VOL. 21, NO. 5, May 2000, pp. 286-288

SUMMARY OF INVENTION

Technical Problem

In general, it is necessary to change the turn-on voltage of Schottky barrier diode according to the intended use thereof. Schottky barrier diode having a $Ga_2O_3$-based semiconductor layer is also required to have a turn-on voltage in a range different from the known Schottky barrier diodes, particularly, to have a low turn-on voltage so that forward loss can be kept low.

Thus, it is an object of the invention to provide a Schottky barrier diode which is formed using a $Ga_2O_3$-based semiconductor and has a lower turn-on voltage than the known Schottky barrier diodes.

Solution to Problem

To achieve the above-mentioned object, an aspect of the invention provides a Schottky barrier diode according to [1] to [3] below.

[1] A Schottky barrier diode, comprising: a semiconductor layer comprising a $Ga_2O_3$-based single crystal; an anode electrode that forms a Schottky junction with the semiconductor layer and is configured so that a portion in contact with the semiconductor layer comprises Mo or W; and a cathode electrode, wherein a turn-on voltage thereof is not less than 0.3 V and not more than 0.5 V.

[2] A Schottky barrier diode, comprising: a first semiconductor layer that comprises a $Ga_2O_3$-based single crystal and has a trench opening on one surface; a second semiconductor layer that comprises a $Ga_2O_3$-based single crystal and is stacked on a surface of the first semiconductor layer on which the trench is not open; an insulating film covering an inner surface of the trench; a trench MOS barrier buried in the trench so as to be covered with the insulating film; an anode electrode that forms a Schottky junction with the first semiconductor layer, is in contact with the trench MOS barrier and is configured so that a portion in contact with the first semiconductor layer comprises Mo or W; and a cathode electrode connected to the second semiconductor layer.

[3] The Schottky barrier diode according to [2], wherein a turn-on voltage thereof is not less than 0.4 V and not more than 0.6 V.

Advantageous Effects of Invention

According to the invention, it is possible to provide a Schottky barrier diode which is formed using a $Ga_2O_3$-based semiconductor and has a lower turn-on voltage than the known Schottky barrier diodes.

DESCRIPTION OF EMBODIMENTS

First Embodiment (Configuration of Schottky Barrier Diode)

Figure 1:
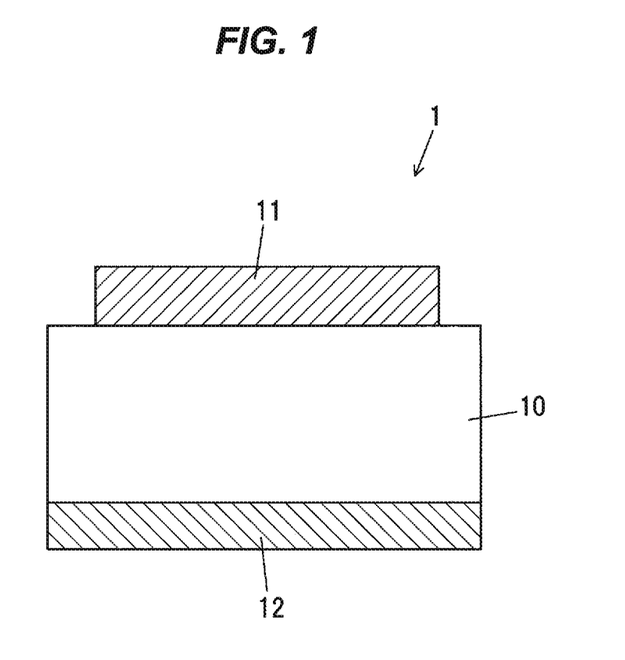
FIG. 1 is a vertical cross-sectional view showing a Schottky barrier diode 1 in the first embodiment.

FIG. 1 is a vertical cross-sectional view showing a Schottky barrier diode 1 in the first embodiment. The Schottky barrier diode 1 is a vertical Schottky barrier diode and has a semiconductor layer 10, an anode electrode 11 formed on one surface of the semiconductor layer 10, and a cathode electrode 12 formed on another surface of the semiconductor layer 10.

The semiconductor layer 10 is a plate-shaped member formed of a $Ga_2O_3$-based single crystal and is typically a $Ga_2O_3$-based substrate. The semiconductor layer 10 may be undoped (with no intentional doping) or may contain a dopant such as Si or Sn. A carrier concentration of the semiconductor layer 10 is preferably, e.g., not less than $1\times10^{15}$ $cm^{-3}$ and not more than $1\times10^{18}$ $cm^{-3}$.

The $Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ ($0<x\leq1$, $0\leq y<1$, $0<x+y\leq1$) single crystal which is a $Ga_2O_3$ single crystal doped with Al and In. The band gap is widened by adding Al and is narrowed by adding In. The $Ga_2O_3$ single crystal mentioned above has, e.g., a β-crystal structure.

A thickness of the semiconductor layer 10 is preferably not less than 100 nm so that the Schottky barrier diode 1 can have sufficient withstand voltage characteristics. Withstand voltage of the Schottky barrier diode 1 is determined by the thickness and carrier concentration of the semiconductor layer 10. There is no specific upper limit for the thickness of the semiconductor layer 10. However, since electrical resistance in the thickness direction increases with an increase in the thickness, the semiconductor layer 10 is preferably as thin as possible provided that the required withstand voltage characteristics are obtained.

The semiconductor layer 10 may alternatively have a multilayer structure composed of two or more $Ga_2O_3$-based single crystal layers. In this case, the semiconductor layer 10 is composed of, e.g., a $Ga_2O_3$-based single crystal substrate and a $Ga_2O_3$-based single crystal film epitaxially grown thereon. In case that the anode electrode 11 is connected to the $Ga_2O_3$-based single crystal film and the cathode electrode 12 is connected to the $Ga_2O_3$-based single crystal substrate, for example, the carrier concentration of the $Ga_2O_3$-based single crystal film is set to not less than $1\times10^{15}$ $cm^{-3}$ and not more than $1\times10^{17}$ $cm^{-3}$ and the carrier concentration of the $Ga_2O_3$-based single crystal substrate is set to not less than $1\times10^{17}$ $cm^{-3}$ and not more than $4\times10^{19}$ $cm^{-3}$.

The anode electrode 11 is configured so that a portion in contact with the semiconductor layer 10 is formed of Mo (molybdenum) or W (tungsten). In detail, the anode electrode 11 when having a single layer structure is entirely formed of Mo or W, and the anode electrode 11 when having a multilayer structure is configured so that a layer in contact with the semiconductor layer 10 is formed of Mo or W. In both cases, a Schottky barrier is formed at an interface between the Mo or W portion of the anode electrode 11 and the semiconductor layer 10, and a Schottky junction is formed between the anode electrode 11 and the semiconductor layer 10.

When the portion of the anode electrode 11 in contact with the semiconductor layer 10 is formed of Mo, the turn-on voltage of the Schottky barrier diode 1 is not less than 0.3V and not more than 0.5V. Meanwhile, when the portion of the anode electrode 11 in contact with the semiconductor layer 10 is formed of W, the turn-on voltage of the Schottky barrier diode 1 is also not less than 0.3V and not more than 0.5V.

The thickness of the Mo or W portion of the anode electrode 11 is preferably not less than 10 nm. When the thickness is less than 10 nm, pinholes may be formed and good rectifying properties may not be obtained. In contrast, when the Mo or W portion of the anode electrode 11 has a thickness of not less than 10 nm, good rectifying properties are obtained. In addition, when the anode electrode 11 has a single layer structure, differential on-resistance after the current value started to rise is reduced.

There is no upper limit for the thickness of the Mo or W portion of the anode electrode 11 in terms of performance of element.

When the anode electrode 11 has a stacked structure, e.g., an Au layer is stacked on a layer formed of Mo or W. The Au layer is used to reduce wiring resistance of the electrode itself. The thicker Au layer is better for reducing the wiring resistance, but the thickness of the Au layer is preferably not more than 10 μm in view of the manufacturing cost.

The cathode electrode 12 is configured so that a portion in contact with the semiconductor layer 10 is formed of a metal such as Ti forming an ohmic junction with $Ga_2O_3$-based single crystal and thus forms an ohmic junction with the semiconductor layer 10. That is, the cathode electrode 12 when having a single layer structure is entirely formed of Ti, etc., and the cathode electrode 12 when having a multilayer structure is configured so that a layer in contact with the semiconductor layer 10 is formed of Ti, etc. Examples of the multilayer structure of the cathode electrode 12 include Ti/Au and Ti/Al.

In the Schottky barrier diode 1, an energy barrier at an interface between the anode electrode 11 and the semiconductor layer 10 as viewed from the semiconductor layer 10 is lowered by applying forward voltage between the anode electrode 11 and the cathode electrode 12 (positive potential on the anode electrode 11 side), allowing a current to flow from the anode electrode 11 to the cathode electrode 12. On the other hand, when reverse voltage is applied between the anode electrode 11 and the cathode electrode 12 (negative potential on the anode electrode 11 side), the current does not flow due to the Schottky barrier.

(Method for Manufacturing Schottky Barrier Diode)

An example of a method for manufacturing the Schottky barrier diode 1 will be described below.

Firstly, a bulk crystal of a $Ga_2O_3$-based single crystal grown by a melt-growth technique such as the FZ (Floating Zone) method or the EFG (Edge Defined Film Fed Growth) method is sliced and the surface thereof is then polished, thereby forming a $Ga_2O_3$-based substrate as the semiconductor layer 10.

Next, the front and back surfaces of the semiconductor layer 10 are pre-treated with a sulfuric acid/hydrogen peroxide mixture (e.g., with a volume ratio of sulfuric acid: hydrogen peroxide:water=4:1:1). In case that a treatment solution other than the sulfuric acid/hydrogen peroxide mixture, such as hydrochloric acid, nitric acid, sulfuric acid, hydrofluoric acid or buffered hydrofluoric acid, is used, treatment with the sulfuric acid/hydrogen peroxide mixture is performed after treatment with such solution. If treatment with the sulfuric acid/hydrogen peroxide mixture is not performed at the end of the pre-treatment, it could cause the turn-on voltage of the Schottky barrier diode 1 to be fixed to about 0.8V to 1.0V, regardless of the material of the anode electrode 11.

Next, the anode electrode 11 and the cathode electrode 12 are respectively formed on the front and back surfaces of the semiconductor layer 10 by vacuum deposition, etc. The anode electrode 11 may be patterned into a predetermined shape such as circle by photo etching, etc.

Second Embodiment (Configuration of Trench MOS Schottky Barrier Diode)

Figure 2A:
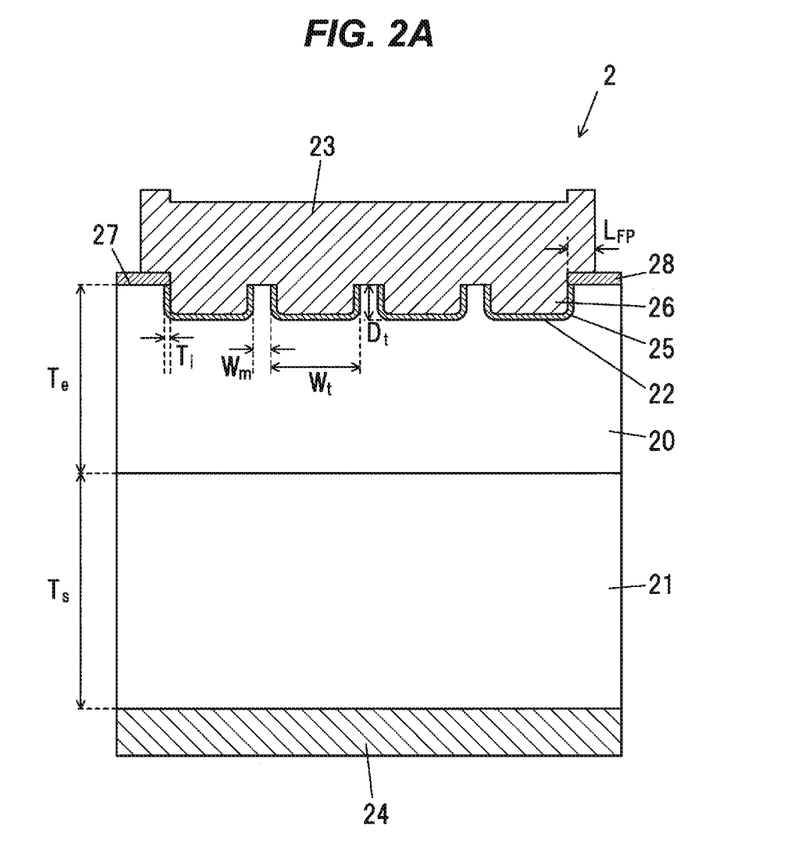
FIG. 2A is a vertical cross-sectional view showing a trench MOS Schottky barrier diode in the second embodiment.

FIG. 2A is a vertical cross-sectional view showing a trench MOS Schottky barrier diode 2 in the second embodiment. The trench MOS Schottky barrier diode 2 is a vertical Schottky barrier diode having a trench MOS region.

The trench MOS Schottky barrier diode 2 has a first semiconductor layer 20, a second semiconductor layer 21 stacked thereon, an anode electrode 23 connected to the first semiconductor layer 20, and a cathode electrode 24 connected to the second semiconductor layer 21.

The first semiconductor layer 20 has trenches 22 opening on a surface 27 opposite to the second semiconductor layer 21. Inner surfaces of the trenches 22 are covered with insulating films 25, and trench MOS barriers 26 are buried in the trenches 22 so as to be covered with the insulating films 25. The anode electrode 23 is in contact with the trench MOS barriers 26.

The trench MOS Schottky barrier diode 2 has a field-plate structure to prevent insulation breakdown from occurring at an edge portion of the electrode and to improve withstand voltage. A dielectric film 28 formed of a dielectric material such as $SiO_2$ is provided on the surface 27 of the first semiconductor layer 20 so as to be located around the anode electrode 23, and the edge of the anode electrode 23 rides over the dielectric film 28.

In the trench MOS Schottky barrier diode 2, an energy barrier at an interface between the anode electrode 23 and the first semiconductor layer 20 as viewed from the first semiconductor layer 20 is lowered by applying forward voltage between the anode electrode 23 and the cathode electrode 24 (positive potential on the anode electrode 23 side), allowing a current to flow from the anode electrode 23 to the cathode electrode 24.

On the other hand, when reverse voltage is applied between the anode electrode 23 and the cathode electrode 24 (negative potential on the anode electrode 23 side), the current does not flow due to the Schottky barrier. When reverse voltage is applied between the anode electrode 23 and the cathode electrode 24, a depletion layer spreads from an interface between the anode electrode 23 and the first semiconductor layer 20 and from an interface between the insulating films 25 and the first semiconductor layer 20.

In general, the upper limit of reverse leakage current in Schottky barrier diode is 1 µA. In the embodiment, reverse voltage when a leakage current of 1 µA flows is defined as withstand voltage.

According to data of dependence of reverse leakage current on electric field strength at Schottky interface in Schottky diode having a SiC semiconductor layer described in, e.g., "Technology of Semiconductor SiC and its Application" by Hiroyuki Matsunami, Noboru Otani, Tsunenobu Kimoto und Takashi Nakamura, Second Edition, Nikkan Kogyo Shimbun, Ltd., Sep. 30, 2011, p. 355, electric field strength immediately under Schottky electrode is about 0.8 MV/cm when a current density of reverse leakage current is 0.0001 $A/cm^2$. 0.0001 $A/cm^2$ here is a current density immediately under the Schottky electrode when a current of 1 µA flows through the Schottky electrode having a size of 1 mm×1 mm.

Thus, even when breakdown field strength of the semiconductor material itself is several MV/cm, a leakage current of more than 1 µA flows when the electric field strength immediately under the Schottky electrode exceeds 0.8 MV/cm.

In order to obtain withstand voltage of 1200V in, e.g., a known Schottky diode not having a special structure to reduce electric field strength immediately under Schottky electrode, a donor concentration in a semiconductor layer needs to be reduced to the order of $10^{15}$ $cm^{-3}$ and also the semiconductor layer needs to be very thick so that the electric field strength immediately under the Schottky electrode is kept not more than 0.8 MV/cm. This causes a significant increase in conduction loss, and it is thus difficult to make a Schottky barrier diode having a high withstand voltage and low loss.

The trench MOS Schottky barrier diode 2 in the second embodiment has a trench MOS structure and thus can have a high withstand voltage without an increase in resistance of the semiconductor layer. In other words, the trench MOS Schottky barrier diode 2 is a Schottky barrier diode having a high withstand voltage and low loss.

Junction barrier Schottky (JBS) diode is known as a Schottky barrier diode having a high withstand voltage and low loss. However, $Ga_2O_3$ is not suitable as a material for the JBS diode requiring a p-type region since it is difficult to manufacture p-type $Ga_2O_3$.

The second semiconductor layer 21 is formed of an n-type $Ga_2O_3$-based single crystal containing a Group IV element, such as Si or Sn, as a donor. A donor concentration of the second semiconductor layer 21 is, e.g., not less than $1.0\times10^{18}$ and not more than $1.0\times10^{20}$ $cm^{-3}$. A thickness T. of the second semiconductor layer 21 is, e.g., 10 to 600 µm. The second semiconductor layer 21 is, e.g., a $Ga_2O_3$-based single crystal substrate.

The first semiconductor layer 20 is formed of an n-type $Ga_2O_3$-based single crystal containing a Group IV element, such as Si or Sn, as a donor. A donor concentration of the first semiconductor layer 20 is lower than the donor concentration of the second semiconductor layer 21. The first semiconductor layer 20 is, e.g., an epitaxial layer epitaxially grown on the second semiconductor layer 21 which is a Ga$_2$O$_3$-based single crystal substrate.

A high-donor-concentration layer containing a high concentration of donor may be additionally formed between the first semiconductor layer 20 and the second semiconductor layer 21. In other words, the first semiconductor layer 20 and the second semiconductor layer 21 may be stacked via the high-donor-concentration layer. The high-donor-concentration layer is used when, e.g., the first semiconductor layer 20 is epitaxially grown on the second semiconductor layer 21 as a substrate. At the early growth stage of the first semiconductor layer 20, the amount of dopant incorporated thereinto is unstable and an acceptor impurity is diffused from the second semiconductor layer 21 as a substrate. Thus, in some cases, resistance increases in a region of the first semiconductor layer 20 close to the interface with the second semiconductor layer 21 when the first semiconductor layer 20 is grown directly on the second semiconductor layer 21. The high-donor-concentration layer is used to avoid such problems. The concentration in the high-donor-concentration layer is set to be, e.g., higher than the concentration in the first semiconductor layer 20, more preferably, higher than the concentration in the second semiconductor layer 21.

As the donor concentration in the first semiconductor layer 20 increases, electrical field strength in each part of the trench MOS Schottky barrier diode 2 increases. The donor concentration in the first semiconductor layer 20 is preferably not more than about $1.0 \times 10^{17}$ cm$^{-3}$ to lower the maximum electric field strength in a region of the first semiconductor layer 20 immediately under the anode electrode 23, the maximum electric field strength in the first semiconductor layer 20 and the maximum electric field strength in the insulating film 25. On the other hand, as the donor concentration decreases, resistance of the first semiconductor layer 20 increases and the forward loss increases. Therefore, to obtain withstand voltage of, e.g., not more than 1200V, the donor concentration is preferably not less than $3.0 \times 10^{16}$ cm$^{-3}$. To obtain higher withstand voltage, the donor concentration may be reduced to, e.g., about $1.0 \times 10^{16}$ cm$^{-3}$. As a thickness $T_e$ of the first semiconductor layer 20 increases, the maximum electric field strength in the first semiconductor layer 20 and the maximum electric field strength in the insulating film 25 decrease. By adjusting the thickness $T_e$ of the first semiconductor layer 20 to not less than about 3 μm, it is possible to effectively reduce the maximum electric field strength in the first semiconductor layer 20 and the maximum electric field strength in the insulating film 25. In view of reduction in these maximum electric field strengths and downsizing of the trench MOS Schottky barrier diode 2, the thickness $T_e$ of the first semiconductor layer 20 is preferably about not less than 3 μm and not more than 9 μm.

Electrical field strength in each part of the trench MOS Schottky barrier diode 2 changes depending on a depth $D_t$ of the trench 22. The depth $D_t$ of the trench 22 is preferably about not less than 1.5 μm and not more than 6 μm to lower the maximum electric field strength in a region of the first semiconductor layer 20 immediately under the anode electrode 23, the maximum electric field strength in the first semiconductor layer 20 and the maximum electric field strength in the insulating film 25.

When a width $W_t$ of the trench 22 is narrower, the conduction loss can be more reduced but it is more difficult to manufacture, causing a decrease in production yield. Therefore, the width $W_t$ is preferably not less than 0.3 μm and not more than 5 μm.

As a width $W_m$ of a mesa-shaped portion between adjacent trenches 22 on the first semiconductor layer 20 decreases, the maximum electric field strength in a region of the first semiconductor layer 20 immediately under the anode electrode 23 decreases. The width $W_m$ of the mesa-shaped portion is preferably not more than 5 μm to lower the maximum electric field strength in a region of the first semiconductor layer 20 immediately under the anode electrode 23. At the same time, the width $W_m$ of the mesa-shaped portion is preferably not less than 0.25 μm since it is more difficult to make the trenches 22 when the width of the mesa-shaped portion is smaller.

Since the maximum electric field strength in the insulating film 25 decreases as permittivity of the insulating film 25 increases, the insulating film 25 is preferably formed of a high-permittivity material. For example, Al$_2$O$_3$ (relative permittivity of about 9.3) and HfO$_2$ (relative permittivity of about 22) can be used as a material of the insulating film 25, and it is particularly preferable to use HfO$_2$ which has high permittivity.

Meanwhile, as a thickness $T_i$ of the insulating film 25 increases, the maximum electric field strength in the first semiconductor layer 20 decreases but the maximum electric field strength in the insulating film 25 and the maximum electric field strength in a region immediately under the anode electrode 23 increase. In view of ease of manufacturing, the thickness of the insulating film 25 is preferably smaller, and is more preferably not more than 300 nm. It is, however, obvious that a certain thickness is required so that a current virtually does not flow directly between the trench MOS barrier 26 and the second semiconductor layer 20.

A length $L_{FP}$ of overlap between the anode electrode 23 and the dielectric film 28 is preferably not less than 20 μm so that the effect of the field-plate structure to improve withstand voltage is sufficiently exerted.

The anode electrode 23 is configured so that a portion in contact with the first semiconductor layer 20 is formed of Mo or W, and the anode electrode 23 is in Schottky contact with the first semiconductor layer 20.

The material of the trench MOS barrier 26 is not specifically limited as long as it is electrically conductive, and it is possible to use, e.g., polycrystalline Si doped at a high concentration and a metal such as Ni or Au. However, when the trench MOS barriers 26 and the anode electrode 23 are formed integrally as shown in FIG. 2A, the surface layer of each trench MOS barrier 26 is also formed of Mo or W since the portion of the anode electrode 23 in contact with the first semiconductor layer 20 is formed of Mo or W.

Figure 2B:
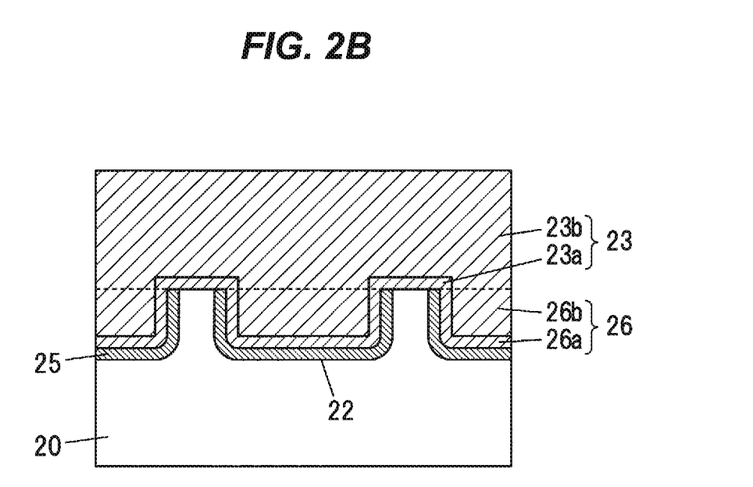
FIG. 2B is an enlarged view showing the vicinity of a trench when trench MOS barriers and an anode electrode are formed integrally.

FIG. 2B is an enlarged view showing the vicinity of the trench 22 when the trench MOS barriers 26 and the anode electrode 23 are formed integrally. The anode electrode 23 has a first layer 23a in contact with the first semiconductor layer 20, and a second layer 23b formed thereon. The trench MOS barrier 26 has a first layer 26a in contact with the insulating film 25, and a second layer 26b formed thereon.

The first layer 23a of the anode electrode 23 and the first layers 26a of the trench MOS barriers 26 are formed as a continuous single film of Mo or W. Likewise, the second layer 23b of the anode electrode 23 and the second layers 26b of the trench MOS barriers 26 are formed as a continuous single film of a conductive material such as Au.

When the portion of the anode electrode 23 in contact with the first semiconductor layer 20 (i.e., the first layer 23a) is formed of Mo or W, the turn-on voltage of the trench MOS Schottky barrier diode 2 is not less than 0.4V and not more than 0.6V. This turn-on voltage is slightly higher than that of the Schottky barrier diode 1 in the first embodiment even though the anode electrode material is the same, because the trench MOS structure causes a potential barrier to be formed in the mesa-shaped portion. This is determined by the width $W_m$ of the mesa-shaped portion, such that the smaller the width $W_m$, the higher the turn-on voltage.

The electric field strength in the trench MOS Schottky barrier diode 2 is affected by the width of the mesa-shaped portion between two adjacent trenches 22, the depth $D_t$ of the trench 22 and the thickness $T_t$ of the insulating film 25, etc., as described above but is hardly affected by the planar pattern of the trenches 22. Therefore, the planar pattern of the trenches 22 on the first semiconductor layer 20 is not specifically limited.

The cathode electrode 24 is in in ohmic contact with the second semiconductor layer 21. The cathode electrode 24 is formed of a metal such as Ti. The cathode electrode 24 may have a multilayer structure formed by stacking different metal films, e.g., Ti/Au or Ti/Al. For reliable ohmic contact between the cathode electrode 24 and the second semiconductor layer 21, the cathode electrode 24 is preferably configured that a layer in contact with the second semiconductor layer 21 is formed of $T_i$.

(Method for Manufacturing Trench MOS Schottky Barrier Diode)

An example of a method for manufacturing the trench MOS Schottky barrier diode 2 will be described below.

FIGS. 3A to 3C, 4A to 4C, 5A and 5B are vertical cross-sectional views showing a process of manufacturing the trench MOS Schottky barrier diode 2 in the second embodiment.

Figure 3A:
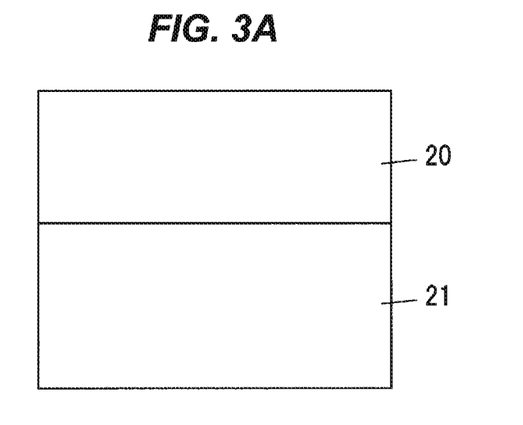
FIG. 3A is a vertical cross-sectional view showing a process of manufacturing the trench MOS Schottky barrier diode in the second embodiment.

Firstly, as shown in FIG. 3A, a $Ga_2O_3$-based single crystal is epitaxially grown on the second semiconductor layer 21 such as a $Ga_2O_3$-based single crystal substrate by the HVPE (Hydride Vapor Phase Epitaxy) method, etc., thereby forming the first semiconductor layer 20.

Figure 3B:
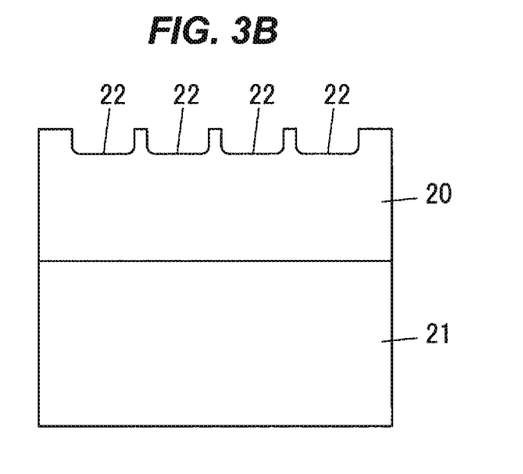
FIG. 3B is a vertical cross-sectional view showing the process of manufacturing the trench MOS Schottky barrier diode in the second embodiment.

Next, as shown in FIG. 3B, the trenches 22 are formed on the upper surface of the first semiconductor layer 20 by photolithography and dry etching, etc.

In case that dry etching is used to form the trenches 22, the preferable conditions are, e.g., use of $BCl_3$ (30 sccm) as an etching gas, pressure of 1.0 Pa, antenna power of 160 W, bias power of 17 W, and duration of 90 minutes.

Treatment with phosphoric acid is preferably performed after forming the trenches 22 to remove roughness or plasma damage on inner surfaces of the trenches. Typically, immersion in phosphoric acid heated to 130 to 140° C. for 5 to 30 minutes is preferable.

Figure 3C:
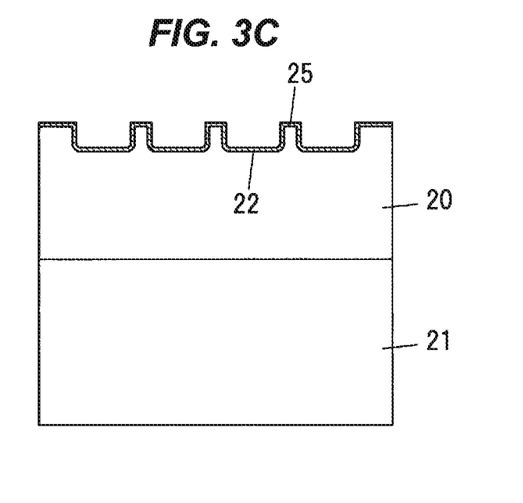
FIG. 3C is a vertical cross-sectional view showing the process of manufacturing the trench MOS Schottky barrier diode in the second embodiment.

Next, as shown in FIG. 3C, the insulating film 25 made of $HfO_2$, etc., is formed on the upper surface of the first semiconductor layer 20 by the ALD (Atomic Layer Deposition) method, etc., so that the inner surfaces of the trenches 22 are covered. The conditions for $HfO_2$ film formation are not specifically limited, and the film is formed by, e.g., alternately supplying TDMAH as an Hf raw material for 0.25 seconds and $O_3$ as an oxidizing agent for 0.15 seconds. The substrate temperature at this time is 250° C.

Figure 4A:
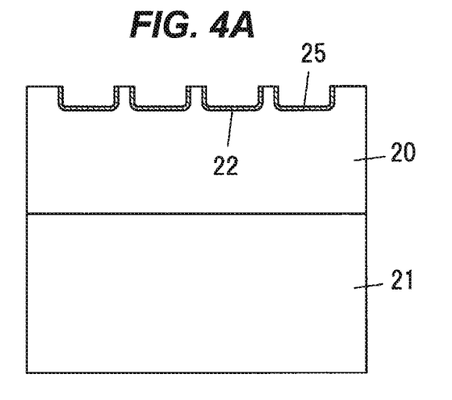
FIG. 4A is a vertical cross-sectional view showing the process of manufacturing the trench MOS Schottky barrier diode in the second embodiment.

Next, as shown in FIG. 4A, part of the insulating film 25 outside the trenches 22 (portions located on the mesa-shaped portions between the trenches 22) is removed by a planarization process such as CMP (Chemical Mechanical Polishing).

Figure 4B:
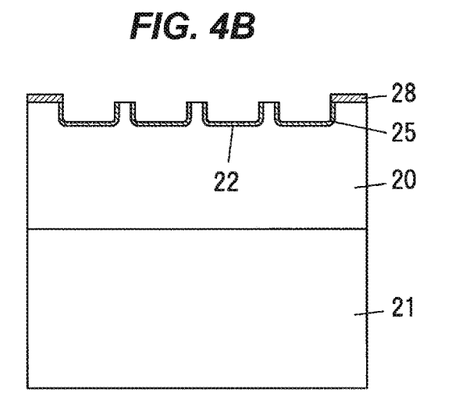
FIG. 4B is a vertical cross-sectional view showing the process of manufacturing the trench MOS Schottky barrier diode in the second embodiment.

Next, as shown in FIG. 4B, the dielectric film 28 is formed on the surface 27 of the first semiconductor layer 20. To form the dielectric film 28, for example, a $SiO_2$ film is deposited on the entire surface 27 by plasma CVD (Chemical Vapor Deposition) or sputtering and is then patterned by fluorine-based dry etching or wet etching with buffered hydrofluoric acid.

Figure 4C:
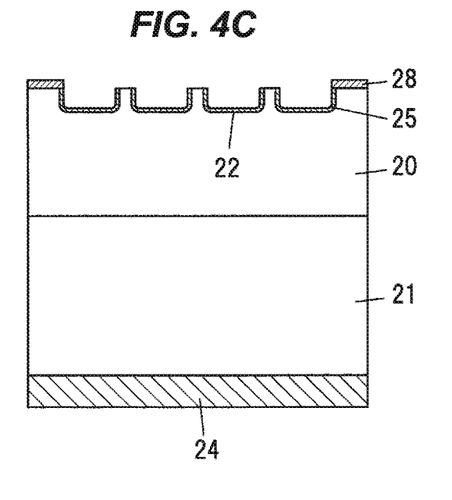
FIG. 4C is a vertical cross-sectional view showing the process of manufacturing the trench MOS Schottky barrier diode in the second embodiment.

Next, as shown in FIG. 4C, the cathode electrode 24 having a Ti/Au stacked structure, etc., is formed on the bottom surface of the second semiconductor layer 21 by electron beam evaporation, etc. After that, heat treatment is performed in a nitrogen atmosphere at 450° C. for 1 minute. This heat treatment reduces contact resistance between the cathode electrode 24 and the second semiconductor layer 21.

Figure 5A:
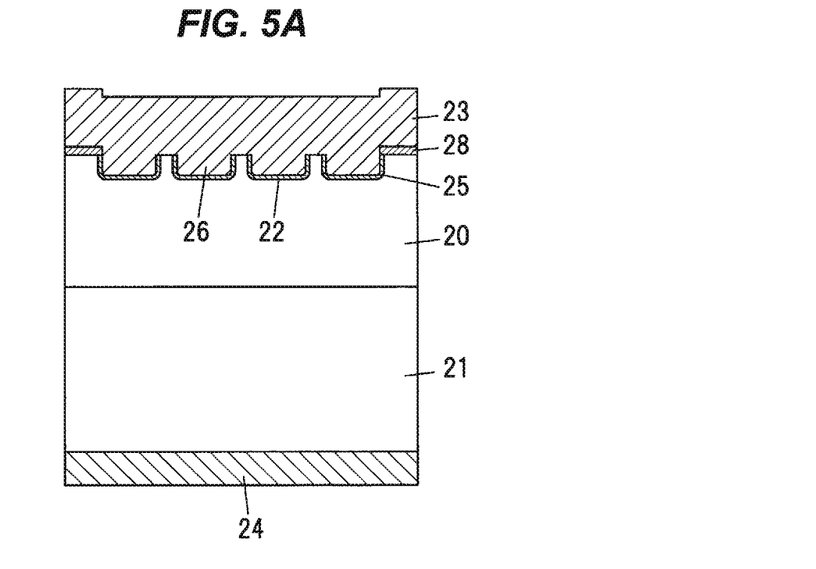
FIG. 5A is a vertical cross-sectional view showing the process of manufacturing the trench MOS Schottky barrier diode in the second embodiment.

Next, as shown in FIG. 5A, the trench MOS barriers 26 and the anode electrode 23, which have a Cu/Au/Ni stacked structure, etc., are formed continuously and integrally by electron beam evaporation, etc.

Before depositing the trench MOS barriers 26 and the anode electrode 23, treatment with a sulfuric acid/hydrogen peroxide mixture is performed to remove CMP abrasive, etc. When a treatment solution other than the sulfuric acid/hydrogen peroxide mixture, such as hydrochloric acid, nitric acid, sulfuric acid, hydrofluoric acid or buffered hydrofluoric acid, is used, treatment with the sulfuric acid/hydrogen peroxide mixture is performed after treatment with such solution to prevent the turn-on voltage from being fixed to about 0.8 to 1.0V.

Figure 5B:
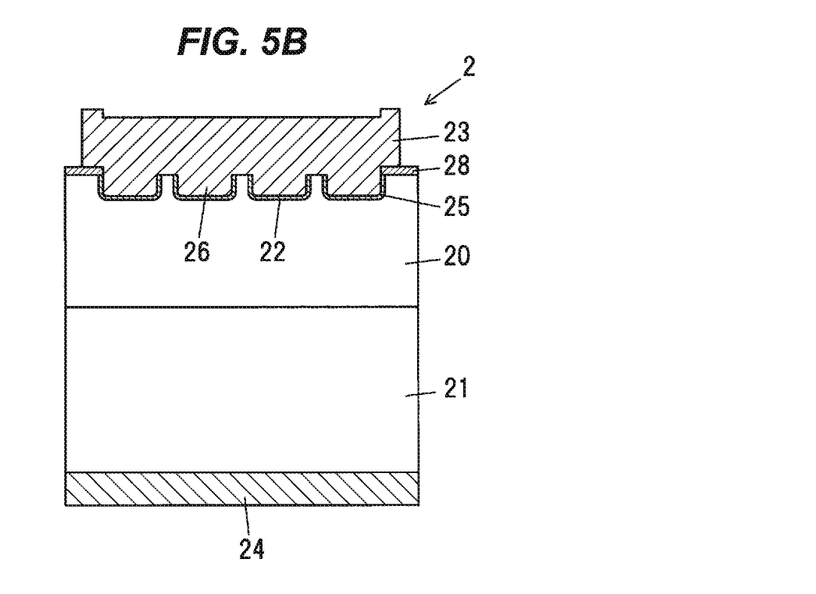
FIG. 5B is a vertical cross-sectional view showing the process of manufacturing the trench MOS Schottky barrier diode in the second embodiment.

Next, as shown in FIG. 5B, the anode electrode 23 is patterned into a predetermined shape such as circle by photolithography and wet etching, etc.

Effects of the Embodiments

In the first and second embodiments, by using Mo or W as the material of the anode electrode which serves as a Schottky electrode, Schottky barrier diode having a semiconductor layer formed of a $Ga_2O_3$-based single crystal can have a lower turn-on voltage than the known Schottky barrier diodes.

Example 1

Using Schottky barrier diodes having the same structure as the Schottky barrier diode 1 in the first embodiment, change in turn-on voltage when the material of the anode electrode serving as a Schottky electrode is different was examined.

In Example 1, a 650 μm-thick $Ga_2O_3$ substrate which was undoped (with no intentionally added donor) and had a donor concentration of about $10^{17}$ $cm^{-3}$ was used as the semiconductor layer.

A circular electrode having a diameter of 200 μm was formed as the anode electrode by electron beam evaporation. Before depositing the anode electrode, the surface of the semiconductor layer was treated with a sulfuric acid/hydrogen peroxide mixture. Al, Ti, Mo, W, Fe, Cu, Ni, Pt and Pd were used as the anode electrode material.

Then, an electrode having a Ti/Au stacked structure formed by stacking a 50 nm-thick Ti film and a 200 nm-thick Au film was formed as the cathode electrode on a portion of the semiconductor layer by electron beam evaporation.

Figure 6:
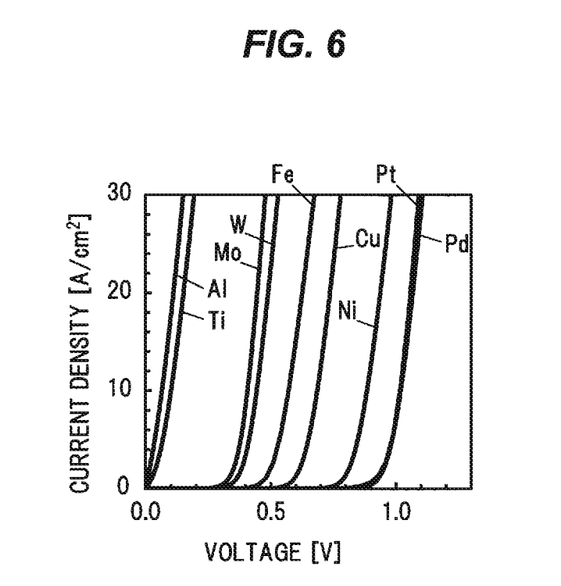
FIG. 6 is a graph showing a relation between a material of the anode electrode and turn-on voltage of the Schottky barrier diode in Example 1.

FIG. 6 is a graph showing a relation between a material of the anode electrode and turn-on voltage of the Schottky barrier diode in Example 1.

FIG. 6 shows that the turn-on voltages of the Schottky barrier diodes, when the anode electrode material is Al, Ti, Mo, W, Fe, Cu, Ni, Pt and Pd, are respectively about 0V, 0.05V, 0.35V, 0.4V, 0.55V, 0.65V, 0.85V, 0.95V and 0.95V.

Of those materials, Ni and Pt are known as materials of Schottky electrode to be in contact with semiconductor layer formed of $Ga_2O_3$-based single crystal. Mo and W provide different turn-on voltages from when using Ni and Pt and are thus usable as new Schottky electrode materials.

When the anode electrode is formed of Mo, the turn-on voltage of the Schottky barrier diode, including variation, is not less than 0.3V and not more than 0.5V. Meanwhile, when the anode electrode is formed of W, the turn-on voltage of the Schottky barrier diode, including variation, is also not less than 0.3V and not more than 0.5V.

Although Ag is a material with a lower turn-on voltage than Mo and W, several experiments confirmed that its repeatability and reproducibility of turn-on voltage is very low and Ag is not suitable as an electrode material for Schottky barrier diode.

Example 2

The trench MOS Schottky barrier diodes 2 in the second embodiment were made, and a relation between the width $W_m$ of the mesa-shaped portion and device characteristics was examined. Also, the device characteristics of the trench MOS Schottky barrier diodes 2 were compared to those of a normal Schottky barrier diode not having trenches.

The configuration of the trench MOS Schottky barrier diodes 2 in Example 2 is as follows.

An Sn-doped $Ga_2O_3$ substrate having a thickness of 570 μm and a donor concentration of $6 \times 10^{18}$ cm$^{-3}$ was used as the second semiconductor layer 21. An Si-doped $Ga_2O_3$ film having a thickness of 5 μm and a donor concentration of $6 \times 10^{16}$ cm$^{-3}$ was used as the first semiconductor layer 20.

The trenches 22 had the depth $D_t$ of about 2.3 μm and the width $W_t$ of 4 μm, the mesa-shaped portion had the width $W_m$ of 2 to 5 μm, and the length $L_{FP}$ of overlap between the anode electrode 23 and the dielectric film 28 was 50 μm. A 50 nm-thick $HfO_2$ film was used as the insulating film 25.

A Mo/Au/Ni stacked film formed by stacking a 30 nm-thick Mo film, a 3000 μm-thick Au film and a 50 nm-thick Ni film was used as the trench MOS barriers 26 and the anode electrode 23. The Mo film and the Au film were buried in the trenches 22. The portion to be the anode electrode 23 was patterned into a circular shape with a diameter of 400 μm. The Ni film as the outermost layer was formed to increase adhesion with photoresist used for the patterning.

A Ti/Au stacked film formed by stacking a 50 nm-thick $T_i$ film and a 200 nm-thick Au film was used as the cathode electrode 24. The cathode electrode 24 was formed on the entire back surface of the Sn-doped $Ga_2O_3$ substrate and annealing was performed at 450° C. for 1 minute to reduce contact resistance with the Sn-doped $Ga_2O_3$ substrate.

For the purpose of comparison, a sample without trenches (normal Schottky barrier diode) was also made on the same epi-wafer.

Figure 7A:
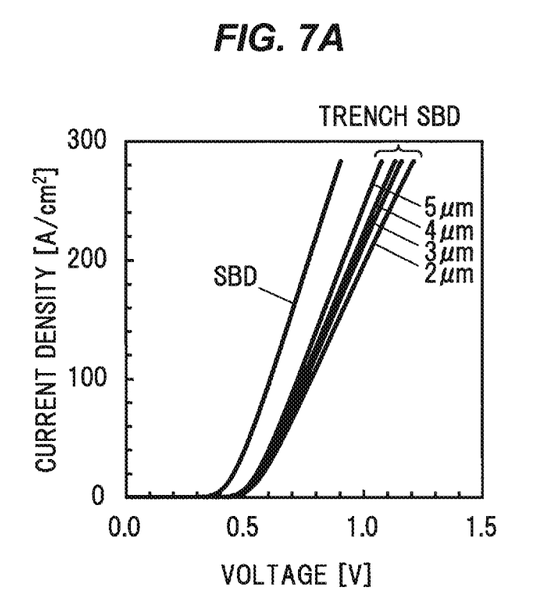
FIG. 7A shows forward characteristics of trench MOS Schottky barrier diodes in Example 2 and of a normal Schottky barrier diode in Comparative Example.

FIG. 7A shows forward characteristics of the trench MOS Schottky barrier diodes 2 in Example 2 and of the normal Schottky barrier diode in Comparative Example.

In the drawing, "trench SBD" denotes the trench MOS Schottky barrier diode 2 and "SBD" denotes the normal Schottky barrier diode as Comparative Example in which trenches are not formed. In addition, each of "2 μm", "3 μm", "4 μm" and "5 m" indicates the width $W_m$ of the mesa-shaped portion of the trench MOS Schottky barrier diode 2.

FIG. 7A shows that on-resistance in the trench MOS Schottky barrier diode 2 increases with a decrease in the width $W_m$ of the mesa-shaped portions. This is because the area of the trench 22 not serving as the current path was increased relative to the area of the mesa-shaped portions serving as the current path in a region under the anode electrode 23, hence, it is a reasonable result.

On the other hand, the turn-on voltage of the trench MOS Schottky barrier diode 2 hardly depends on the width $W_m$ of the mesa-shaped portions and was about 0.55V in each case. The turn-on voltage of the trench MOS Schottky barrier diode 2 in Example 2, including variation, is not less than 0.4V and not more than 0.6V.

In addition, since W as an anode electrode material for the Schottky barrier diode 1 has properties close to those of Mo as described above, W when used in place of Mo in the trench MOS Schottky barrier diode 2 also exhibits properties close to those of Mo, and thus, the turn-on voltage including variation is not less than 0.4V and not more than 0.6V.

In trench MOS Schottky barrier diode as is the trench MOS Schottky barrier diode 2 in the second embodiment, reverse leakage is effectively reduced when the turn-on voltage is not less than 0.4V. This means that when using Mo or W as the anode electrode material, it is possible to lower the turn-on voltage while effectively reducing the reverse leakage.

FIG. 7A also shows that the trench MOS Schottky barrier diode 2 has a higher on-resistance than the normal Schottky barrier diode. This is due to the fact that the electric current path is narrowed by providing the trench MOS structure, hence, it is also a reasonable result.

Figure 7B:
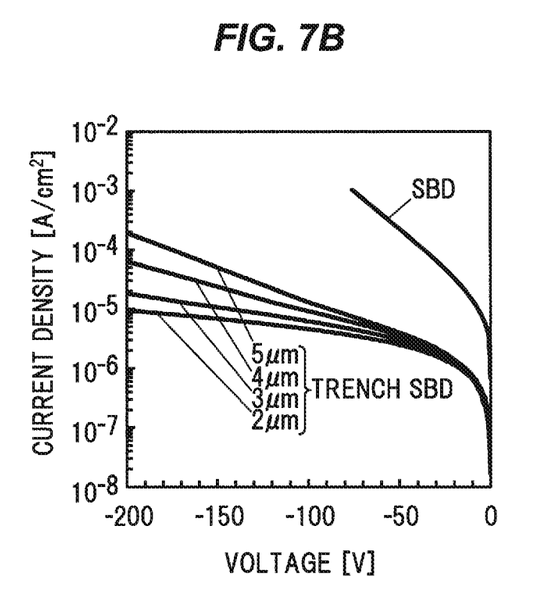
FIG. 7B shows reverse characteristics of the trench MOS Schottky barrier diodes in Example 2 and of the normal Schottky barrier diode in Comparative Example.

FIG. 7B shows reverse characteristics of the trench MOS Schottky barrier diodes 2 in Example 2 and of the normal Schottky barrier diode in Comparative Example.

Based on FIG. 7B, the leakage current in the trench MOS Schottky barrier diode 2 is several orders of magnitude less than that in the normal Schottky barrier diode not having trenches, which confirmed that the trench MOS structure has the effect of increasing the withstand voltage. It was also found that the narrower the width $W_m$ of the mesa-shaped portions, the smaller the reverse leakage current.

Figure 8A:
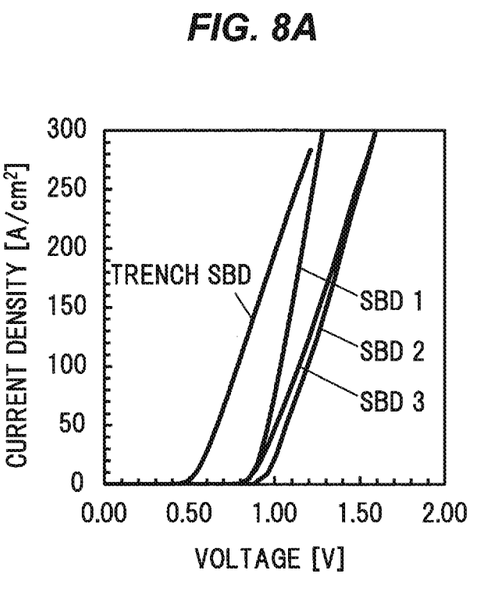
FIG. 8A shows forward characteristics of the trench MOS Schottky barrier diode in Example 2 and of commercially available SiC Schottky barrier diodes in Comparative Example.

FIG. 8A shows forward characteristics of the trench MOS Schottky barrier diode 2 in Example 2 and of commercially available SiC Schottky barrier diodes in Comparative Example. The width $W_m$ of the mesa-shaped portions in the trench MOS Schottky barrier diode 2 pertaining to FIG. 8A and FIG. 8B (described later) is 2 μm.

"SBD1", "SBD2" and "SBD3" in the drawing denote three different types of commercially available SiC Schottky barrier diodes.

Based on FIG. 8A, it was confirmed that the trench MOS Schottky barrier diode 2 using Mo for the anode electrode has a lower turn-on voltage than the commercially available SiC Schottky barrier diodes and operates with low loss.

Figure 8B:
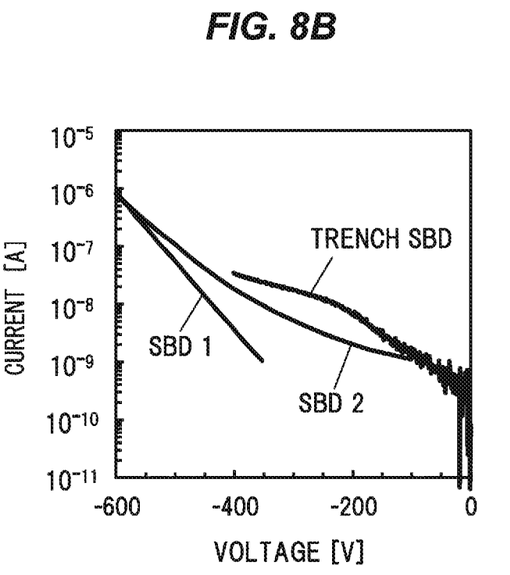
FIG. 8B shows reverse characteristics of the trench MOS Schottky barrier diode in Example 2 and of the commercially available SiC Schottky barrier diodes in Comparative Example.

FIG. 8B shows reverse characteristics of the trench MOS Schottky barrier diode 2 in Example 2 and of the commercially available SiC Schottky barrier diodes in Comparative Example.

Based on FIG. 8B, the reverse leakage current in the trench MOS Schottky barrier diode 2 is reduced to the same level as that in the commercially available SiC Schottky barrier diodes.

The results shown in FIGS. 8A and 8B demonstrate the first-ever proof of performance of $Ga_2O_3$ Schottky barrier diode which surpasses performance of SiC Schottky barrier diode.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples described above. Further, it should be noted that all combinations of the features described in the embodiments and Examples are not necessary to solve the problem of the invention.

INDUSTRIAL APPLICABILITY

Provided is a Schottky barrier diode which is formed using a $Ga_2O_3$-based semiconductor and has a lower turn-on voltage than the known Schottky barrier diodes.

REFERENCE SIGNS LIST

1 SCHOTTKY BARRIER DIODE
2 TRENCH MOS SCHOTTKY BARRIER DIODE
10 SEMICONDUCTOR LAYER
11, 23 ANODE ELECTRODE
12, 24 CATHODE ELECTRODE
20 FIRST SEMICONDUCTOR LAYER
21 SECOND SEMICONDUCTOR LAYER
22 TRENCH
25 INSULATING FILM
26 TRENCH MOS BARRIER
28 DIELECTRIC FILM

The invention claimed is:

1. A Schottky barrier diode, comprising:
a semiconductor layer comprising a $Ga_2O_3$-based single crystal;
an anode electrode that forms a Schottky junction with the semiconductor layer and is configured so that a portion in contact with a surface of the semiconductor layer comprises Mo or W; and
a cathode electrode,
wherein the surface of the semiconductor layer in contact with the anode electrode is configured such that a turn-on voltage of the Schottky barrier diode is not less than 0.3 V and not more than 0.5 V, and
wherein the surface of the semiconductor layer in contact with the portion of the anode electrode comprising Mo or W is treated with a sulfuric acid/hydrogen peroxide mixture.

2. A Schottky barrier diode, comprising:
a first semiconductor layer that comprises a $Ga_2O_3$-based single crystal and has a trench opening on one surface;
a second semiconductor layer that comprises a $Ga_2O_3$-based single crystal and is stacked on a surface of the first semiconductor layer on which the trench is not open;
an insulating film covering an inner surface of the trench;
a trench MOS barrier buried in the trench so as to be covered with the insulating film;
an anode electrode that forms a Schottky junction with the first semiconductor layer, is in contact with the trench MOS barrier and is configured so that a portion in contact with the first semiconductor layer comprises Mo or W; and
a cathode electrode connected to the second semiconductor layer,
wherein the first semiconductor layer is configured such that a turn-on voltage thereof is not less than 0.4 V and not more than 0.6 V.

3. The Schottky barrier diode according to claim 2, wherein the portion of the anode electrode comprising Mo or W is in contact with a surface of the first semiconductor layer treated with a sulfuric acid/hydrogen peroxide mixture.

* * * * *